United States Patent [19]
Ichinohe et al.

[11] Patent Number: 5,193,220
[45] Date of Patent: Mar. 9, 1993

[54] DEVICE FOR MOUNTING AN ELECTRONIC PART

[75] Inventors: Makoto Ichinohe; Masahiro Matai; Shinjiro Umetsu; Seiji Nishikawa, all of Tokyo, Japan

[73] Assignees: NEC Corporation; Nippon Telegraph and Telephone Corporation, both of Japan

[21] Appl. No.: 531,838

[22] Filed: Jun. 1, 1990

[30] Foreign Application Priority Data

Jun. 2, 1989 [JP] Japan .................................. 1-139096
Jun. 2, 1989 [JP] Japan .................................. 1-140883

[51] Int. Cl.$^5$ ......................... H04B 1/38; H01M 2/10
[52] U.S. Cl. .......................... 455/89; 455/90; 455/271; 455/343; 455/347; 429/1; 429/98; 307/127; 320/2; 361/84; 343/702
[58] Field of Search ................ 455/89, 90, 347, 271, 455/283, 343, 127; 429/97, 98, 100, 1; 320/2, 48; 307/127; 324/426; 343/702; 361/84

[56] References Cited

U.S. PATENT DOCUMENTS

| | | | |
|---|---|---|---|
| 4,214,197 | 7/1980 | Mann et al. | 455/89 |
| 4,224,529 | 9/1980 | Fujiwara | 307/127 |
| 4,558,270 | 12/1985 | Liautaud et al. | 455/90 |
| 4,584,709 | 4/1986 | Kneisel et al. | 455/89 |
| 4,641,370 | 2/1987 | Oyamada | 455/90 |
| 4,653,115 | 3/1987 | Holcomb | 455/89 |
| 4,709,201 | 11/1987 | Schaefer et al. | 455/89 |
| 4,828,944 | 5/1989 | Yabe et al. | 429/97 |
| 4,842,966 | 6/1989 | Omori et al. | 429/100 |
| 4,871,629 | 10/1989 | Bunyea | 429/97 |
| 5,020,136 | 5/1991 | Patsiokas et al. | 455/89 |

Primary Examiner—Reinhard J. Eisenzopf
Assistant Examiner—Timothy H. Keough
Attorney, Agent, or Firm—Ostrolenk, Faber, Gerb & Soffen

[57] ABSTRACT

A battery pack mounting device for portable radio equipment having a built-in antenna. The device determines a position of a battery pack, which powers the equipment, inserted in a battery pack accommodating portion provided in the equipment. Various constants which determine the antenna characteristic of the equipment are controlled on the basis of the determined position of the battery pack, thereby maintaining the optimum antenna characteristic at all times. When the device is applied to a charging unit which charges a rechargeable battery, the opposite electrodes of the battery are electrically correctly connected to a pair of connecting terminals which are provided in the charging unit and connected to opposite poles of a charging circuit as the battery pack is inserted in a battery chamber defined in the charging unit. Even when the battery pack is placed in the battery chamber upside down, the opposite electrodes of the battery are accurately connected to the connecting terminals of the charging unit.

12 Claims, 7 Drawing Sheets

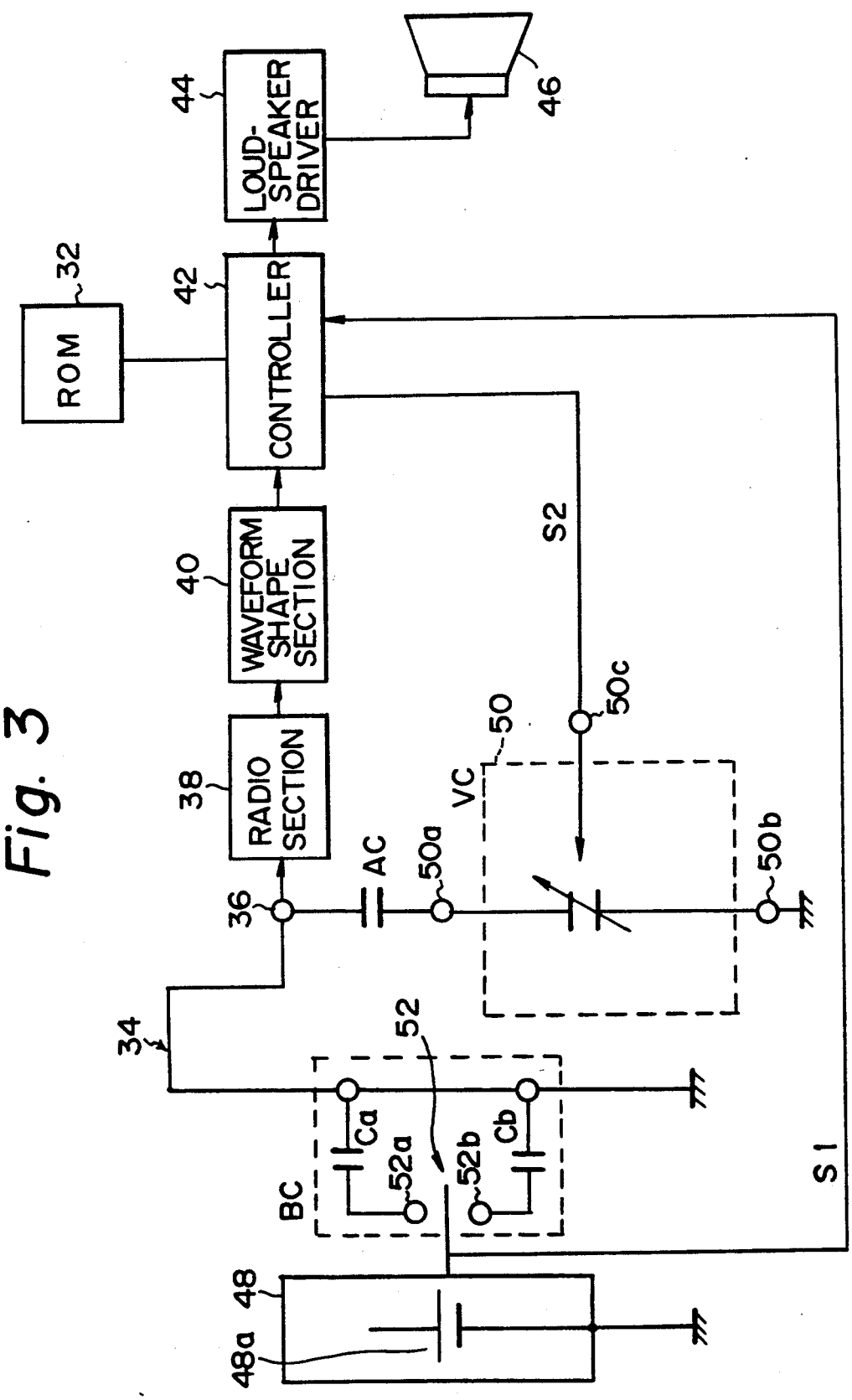

DEVICE FOR MOUNTING AN ELECTRONIC PART

BACKGROUND OF THE INVENTION

The present invention relates to a device for mounting a particular electronic part on electronic equipment and, more particularly, to a battery pack mounting device applicable to electronic equipment of the kind using a battery pack and to a charging unit which charges a rechargeable battery loaded in a battery pack.

A paging receiver or similar portable miniature radio equipment is extensively used today. A majority of such equipment is powered by a battery pack having a battery holder and a battery, especially rechargeable battery, held by the battery holder. The battery pack is removably loaded in a power source section which is provided in the radio equipment. An advantage particular to a battery pack is that all the electrical connections associated with a power source are automatically set up when the battery pack is inserted in a battery pack containing portion defined in the power source section. A current trend in the radio equipment art is toward miniaturization. Miniaturization, however, is difficult to achieve with the conventional layout in which an antenna section and a radio section are ideally spaced apart from each other to optimize their own characteristics. It is necessary, therefore, to implement optimum design which allows the antenna section and ratio section to be located as close to each other as possible while preventing their inherent characteristics from being disturbed.

Specifically, in a conventional paging receiver, an antenna section, a radio section and a power source section which is implemented as the battery pack are arranged extremely close to one another in a predetermined relative position in order to reduce the overall size of the receiver. The antenna section includes metallic plates which constitute a part of the casing of the paging receiver. The radio section is implemented as a printed circuit board loaded with a plurality of electronic parts each being made of metal. The battery pack accommodated in the power source section is loaded with a battery at least the sheath of which is made of metal. Assume that the metallic plates of the antenna section or the printed circuit board of the radio section is disclosed, or that the battery pack is misplaced in the power source section to reverse the polarities of the battery. Then, the designed optimum antenna characteristic of the equipment is apt to change due to the asymmetric configuration of the metallic member which forms the sheath of the battery. More specifically, the antenna characteristic of the equipment is usually designed by assuming a condition wherein all the components such as the printed circuit board and battery pack are mounted on the equipment. Therefore, when the position of the printed circuit board or the position of the battery pack in the equipment is changed, i.e., when the relative position of their metallic members is changed, the capacitance of the entire electric circuitry is changed to prevent the antenna from maintaining the predetermined optimum characteristic. Radio equipment with an implementation for preventing the misplacement of the battery pack in its power source section has been proposed. Such an implementation, however, requires the user to be extremely careful in inserting the battery pack in the power source section. Should the user push the battery pack into the power source section in a wrong position, an undesirable force would act on the connecting portions and casing and, in the worst case, damage the electrical arrangement and/or the casing.

The recharge the battery held by the battery holder of the battery pack, the battery is removed from the battery holder and then loaded in a battery pack accommodating portion of a charging unit. In the battery pack accommodating portion, the positive and negative poles of the battery contact respectively a positive and a negative terminal provided in the portion of interest, so that a current is fed to the battery via the positive and negative terminals. The user, therefore, has to remove the battery from the battery holder of the battery pack every time the battery needs recharging. Moreover, the conventional charging unit is not provided with means for accommodating the battery only in a correct position in the battery pack accommodating portion thereof. Hence, there is a fear that when the battery pack is inserted in the charging unit with its polarities reversed, the battery is damaged by current.

As stated above, difficulties have been experienced in inserting a battery pack or a battery in a correct position in a battery pack accommodating portion of electronic equipment of the type using a battery pack which holds a rechargeable battery in its battery holder, or in a battery accommodating portion of a charging unit for recharging the battery.

SUMMARY OF THE INVENTION

It is therefore an object of the present invention to provide a device for mounting a particular part on electronic equipment.

It is another object of the present invention to provide a device for allowing a battery pack to be mounted in a correct position in a power source section of portable electronic equipment for powering the equipment.

It is another object of the present invention to provide a power pack mounting device which when a battery pack used for powering portable radio equipment with a built-in antenna is changed in position relative to a power source section of the equipment, compensates for the resulting change in antenna characteristic and thereby maintains the optimum antenna characteristic at all times.

It is another object of the present invention to provide a battery pack mounting device which allows a rechargeable battery held by a battery pack to be recharged by a charging unit without being removed from the battery pack.

It is another object of the present invention to provide a device for allowing a battery pack holding a rechargeable battery in a battery holder thereof to be mounted in a correct position on a charging unit at all times.

It is another object of the present invention to provide a generally improved device for mounting electronic part.

A device for mounting a particular part on electronic equipment of the present invention comprises an arrangement for determining a position in which the particular part is mounted on the electronic equipment, and a controller for controlling an operation of the electronic equipment on the basis of the position of the particular part determined by the arrangement.

BRIEF DESCRIPTION OF THE DRAWINGS

The above and other objects, features and advantages of the present invention will become more apparent from the following detailed description taken with the accompanying drawings in which:

FIG. 3 is a block diagram schematically showing a battery pack mounting device embodying the present invention and applied to portable radio equipment;

DESCRIPTION OF THE PREFERRED EMBODIMENTS

Figure 1:
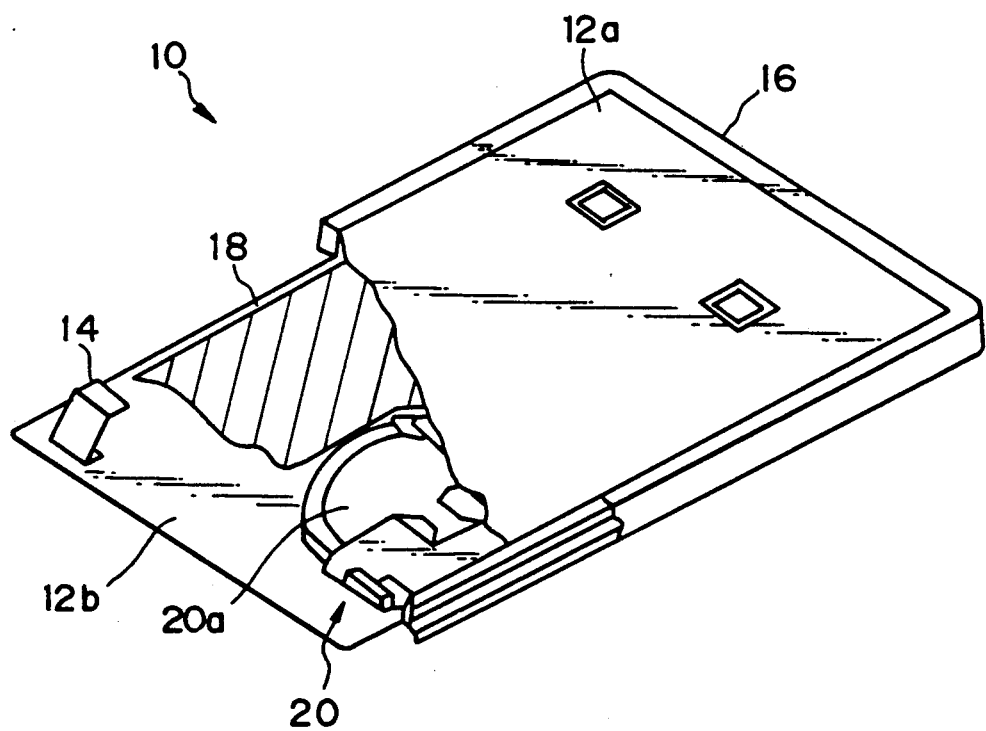
FIG. 1 is a partly taken away perspective view of conventional portable radio equipment, particularly an antenna section, radio section and power source section thereof.

To better understand the present invention, brief reference will be made to a conventional paging receiver, which are of a family of portable radios shown in FIG. 1. As shown, the paging receiver, generally 10, has a casing including a pair of spaced metallic plates 12a and 12b which are electrically connected to each other by a leaf spring 14 and positioned parallel to each other. A frame 16 is affixed to the parallel plates 12a and 12b to close the open ends of the latter. The plates 12a and 12b constitute an antenna section of the paging receiver 10. A printed circuit board 18 is accommodated in the casing and constitutes a radio section of the paging receiver 10. A battery pack 20 is removably loaded in the casing and holds a battery 20a which is the power source for the paging receiver 10. In this sense, the battery pack 20 constitutes a power source section of the paging receiver 10. To miniaturize the paging receiver 10, the antenna section, radio section and power source section are located extremely close to one another. Hence, when the relative position of these sections is changed, the optimum antenna characteristic set at the designing stage is also changed. Specifically, the antenna section is constituted by the two metallic plates 12a and 12b, the radio section is constituted by a number of parts mounted on the printed circuit board 18 and each comprises a metallic member, and the power source section is implemented as the battery pack 20 holding the battery 20a which contains metallic sheath. In this condition, a change in the relative positions of the individual metallic members causes the floating capacitance and, therefore, the antenna characteristic to change.

Figure 2A:
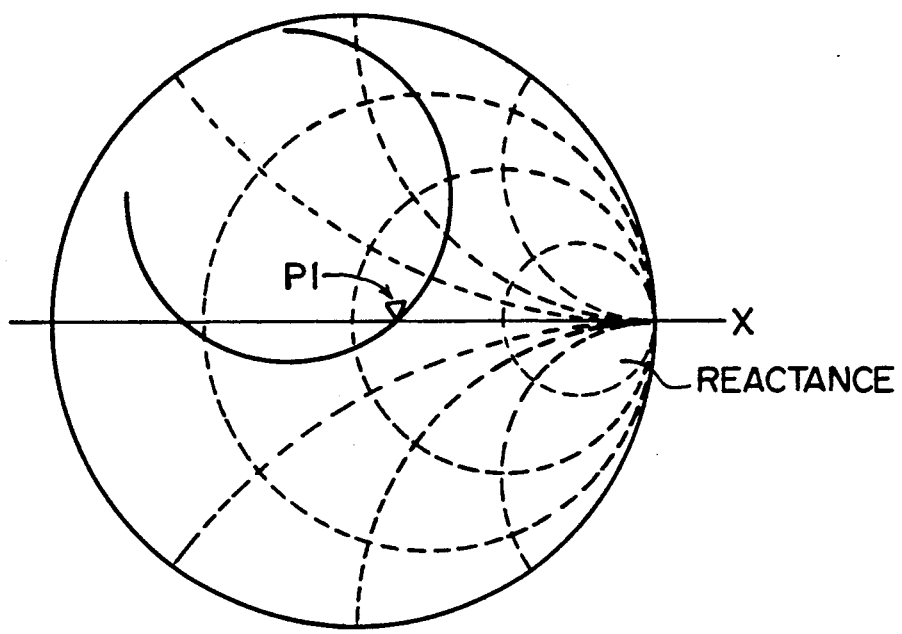
FIGS. 2A and 2B are Smith charts representative of the impedance characteristic of the antenna section.
Figure 2B:
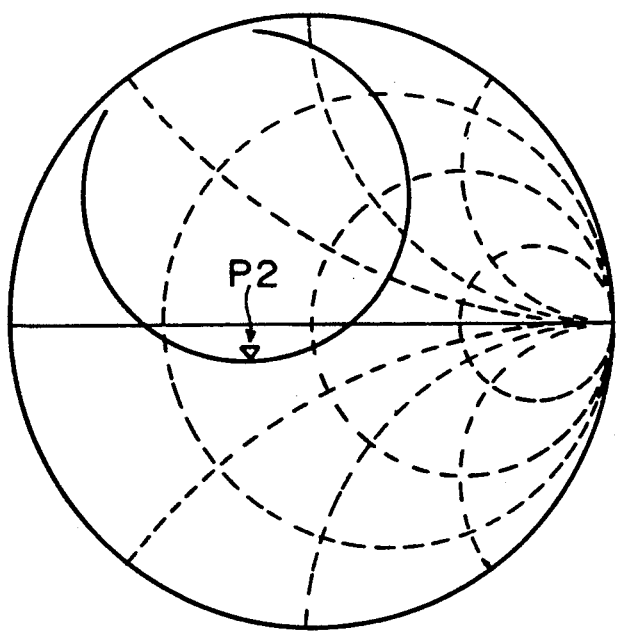

A change in the relative positions of the various sections may result from a change in the distance between the parallel plates 12a and 12b, or misplacement of the battery pack 20 in the power source section, etc. Especially, since the metallic sheath of the battery 20a does not have a symmetric shape, mounting the battery pack 20 upside down, for example, disturbs the positions thereof relative to the metal plates 12a and 12b of the antenna section or to the metallic parts arranged on the printed circuit board 18 and thereby affects the antenna characteristic. This will be described with reference to FIGS. 2A and 2B specifically. As the Smith chart of FIG. 2A indicates, assuming that the battery 20a, or battery back 20, is placed in a correct position in the power source section, the antenna impedance resonates at the channel frequency of the paging receiver 10 at a position P1 which is located on the axis X. As shown in FIG. 2B, when the battery 20a, or battery pack 20, is placed upside down, the antenna impedance is located at position P2 and, due to a change in the capacitance ascribable to the asymmetric shape of the metallic sheath of the battery 20a, it does not resonate at the channel frequency. In this condition, the paging receiver 10 cannot have electric characteristics as would be set up in the correct position of the battery 20.

A preferred embodiment of the battery pack mounting device in accordance with the present invention will be described which is applicable to portable radio equipment such as the paging receiver 10 shown in FIG. 1.

Referring to FIG. 3, electric circuitry representative of the illustrative embodiment is shown. It includes a ROM (Read Only Memory) 32 which stores a paging number assigned to the paging receiver. A paging signal coming in through an antenna 34 is fed to a radio section 38 via a terminal 36, amplified and demodulated thereby. The demodulated output of the radio section 38 is applied to a waveform shaping section 40 so as to shape the waveform of the demodulated output. A controller 42 compares the paging number represented by the demodulated signal with the paging number stored in the ROM 32. If the two paging numbers compared are equal, the controller 42 feeds a sounding signal to a speaker driver 44. In response, the speaker driver 44 drives a loudspeaker 46 to alert the user to the reception of a cell. A battery pack 48 holds a battery 48a and serves as a power source of the radio equipment. The battery pack 48 is inserted in any suitable position in a battery pack containing portion which is formed in a part of a power source section, or casing, of the radio equipment, as will be described.

An antenna section has a reactance component (L) of an antenna element 34 and capacitance component (C) which affects the antenna characteristic, i.e., the antenna section is implemented as an LC resonance antenna. These components L and C are designed such that the antenna section resonates at the channel frequency of the radio equipment. The capacitance components C are comprised of a capacitance component AC particular to the antenna section constituted by the metallic plates and leaf spring 14, FIG. 1, a capacitance component BC between the antenna element 36 and the battery 48a and ascribable to the metallic sheath of the battery 48a in the mounted position, and a capacitance component VC particular to a variable capacitance section 50.

The capacitance component BC derived from the metallic sheath of the battery 48a depends on the position of the battery pack 48 in the battery pack containing portion. Therefore in the circuitry of FIG. 3, the capacitance component BC is implemented as two different capacitances Ca and Cb which are respectively associated with a correct and an incorrect position of the battery pack 48. The capacitance component BC is equivalent to the capacitance between the antenna element 36 and the battery 48a. A switch 52 has terminals 52a and 52b which are connected to the capacitances Ca and Cb, respectively, and serves to sense the position of the battery pack 48 in the battery containing portion. Specifically, the switch 52 detects the position of the battery pack 48 and then connects it to the capacitance Ca or Cb. Since the capacitance component attributable to the battery pack 48 usually varies depending on the position of the battery pack 48, the antenna characteristic varies with the capacitance component. To compensate for the variation of the capacitance component, the switch 52 feeds a signal S1 representative of the position of the battery pack 48 to a controller 42. In response, the controller 42 delivers a control signal S2 to the variable capacitance section 50 to control the capacitance VC, whereby various constants that determine the antenna characteristic are controlled to maintain optimum values.

Figure 4:
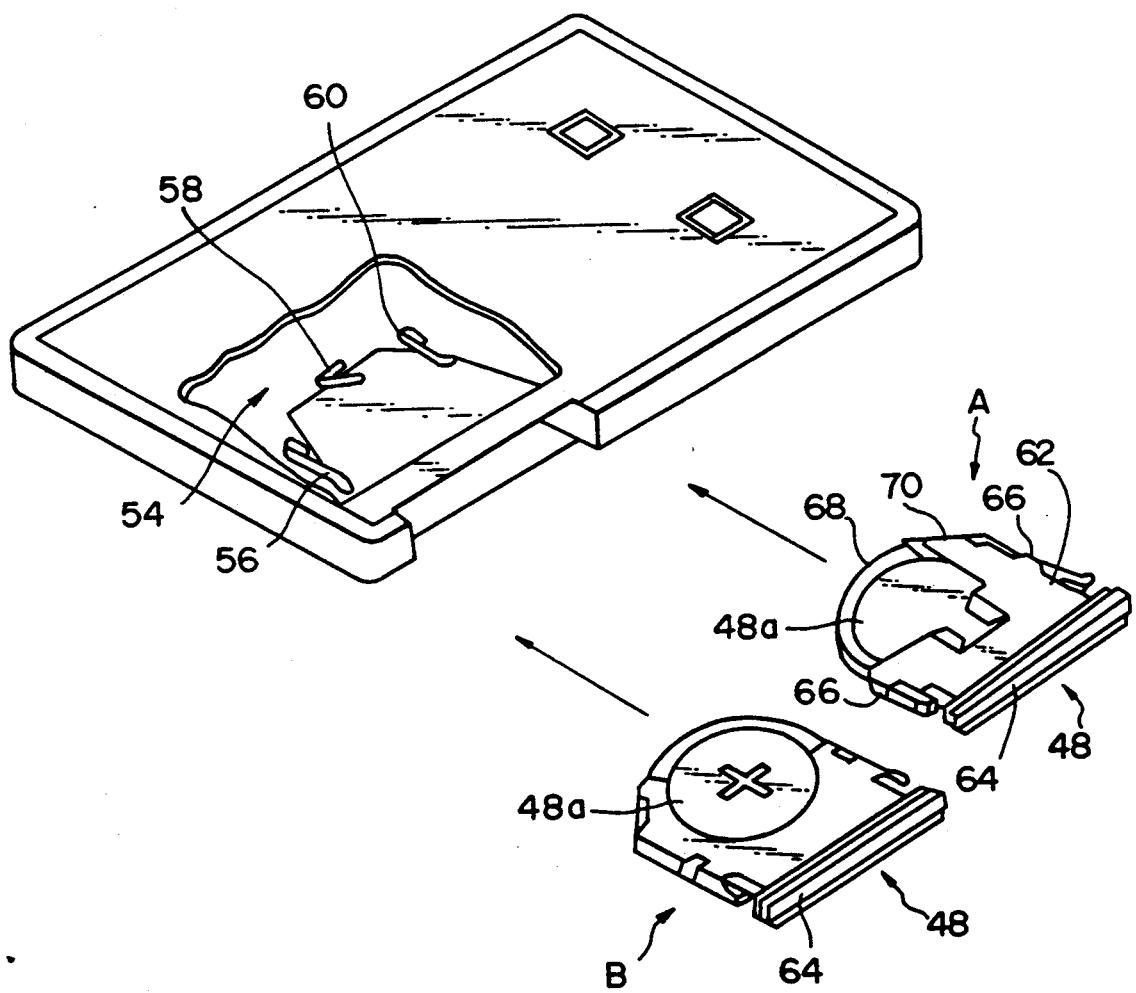
FIG. 4 is a partly taken away perspective view of the illustrative embodiment, showing a specific arrangement for detecting a position of a battery pack.

FIG. 4 shows a specific arrangement for detecting the position of the battery pack 48 in the battery pack compartment portion. As shown, the battery pack containing portion for accommodating the battery pack 48 is defined in a part of the power source section, or casing, of the radio equipment and designated by the reference numeral 54. Arranged in the battery pack containing portion 54 are a negative terminal 56, a positive terminal 58, and a control terminal 60 corresponding to the switch 52 which is responsive to the position of the battery pack 48. The battery pack 48 has the battery 28a, a plate 62, and a battery holder 64. The plate 62 has two negative terminal connecting portions 66 at opposite sides thereof. The connecting portions 66 are positioned symmetrically to each other, and each is connectable to the negative terminal 56. A positive terminal connecting portion 66 is implemented by a part of the metallic sheath of the battery 48a which covers the positive electrode of the battery 48a. Control terminal connecting portion 70 is provided on the negative side of the plate 62 and connectable to the control terminal 60.

Assume that the battery pack 48 is inserted in the battery pack containing portion or, in other words, battery compartment 84 in a position A or a position B, as shown in FIG. 4. Then, when the position be A or B, the positive terminal connecting portion 68 of the battery pack 48 is connected to the positive terminal 58 of the battery pack containing portion 54, while one of the negative terminal connecting portions 66 is connected to the negative terminal 56. Hence, the associated with terminals and connecting portions are electrically properly connected without fail and regard to the position of the battery pack 48 in the battery containing portion 54. In the position A of the battery pack 48, the control terminal connecting portion 70 is connected to the control terminal 60 with the result that the control terminal 60 generates a signal of the same level as the negative terminal 56. On the other hand, in the position B of the battery pack 48, the control terminal connecting portion 70 is not connected to the control terminal 60. In this manner, the position of the battery pack 48 is readily determined on the basis of the connection of the control terminal connecting portion 70 to the control terminal 60.

The control terminal 70 which correspond to the switch 52 as stated above feeds the signal S1 representative of the position of the battery pack 48 to the controller 42. On receiving the signal S1, the controller 42 compensates for the change in the capacitance component BC of the battery section ascribable to the position of the battery pack 48. Assume that an optimum antenna characteristic is designed by using the capacitance Ca associated with the position A as a reference. Then, when the battery pack 48 is inserted in the position B, the controller 42 controls the voltage applied to the variable capacitance section 50 and thereby the capacitance VC in order to compensate for the change from the capacitance Ca to the capacitance Cb.

Figure 5:
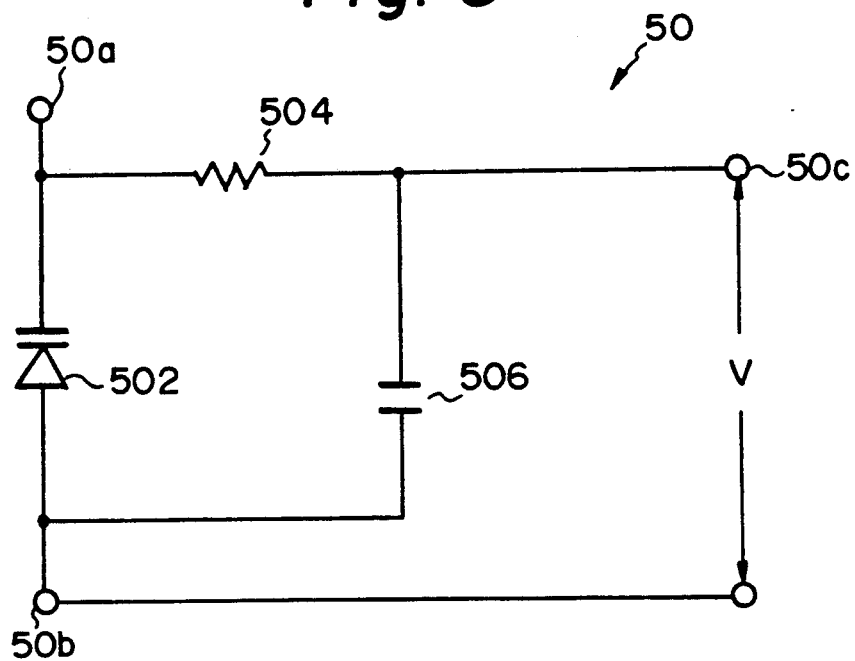
FIG. 5 is a circuit diagram showing a specific construction of a variable capacitor included in the device of FIG. 3.
Figure 6:
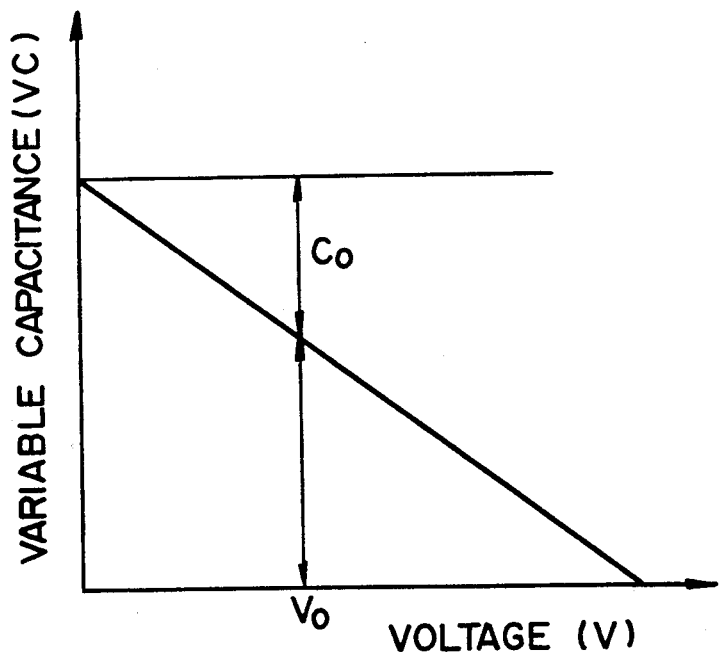
FIG. 6 is a graph indicative of a characteristic of a variable capacitor.

FIG. 5 shows a specific construction of the variable capacitance section 50. As shown. As shown, a resistor 504 and a capacitor 506 are connected to a variable capacitor 502 to prevent the channel frequency signal from flowing into the controller 42. The variable capacitance section 50 has connecting terminals 50a, 50b, and 50c. FIG. 6 is a graph representative of a specific relationship between the applied voltage V and the capacitance VC of the variable capacitor 502. In FIG. 6, the capacitance VC sequentially decreases with the increase in the voltage V. Assume that when the battery pack 48 is inserted in the position B as shown in FIG. 4, the resulting change in the capacitance (Ca−Cb) can be compensated for if the capacitance VC of the variable capacitor 50 is decreased by Co. Then, by selecting the voltage V to be Vo, it is possible to cancel the change in the capacitance BC of the battery section. This is successful in resetting the impedance characteristic shown in FIG. 2B to the correct impedance characteristic shown in FIG. 2A, i.e., in setting up electrical characteristics as would be achieved in the correct position of the battery 48a.

As stated above, in the illustrative embodiment, a position of a battery pack in a battery pack containing portion of a paging receiver or similar portable radio equipment is determined, and various constants which determine the antenna characteristic of the equipment are controlled on the basis of the determined position. Hence, the antenna characteristic is constantly maintained optimum. In addition, since the battery pack can be inserted in the battery pack containing portion without any limitation, the equipment is easy and efficient to operate.

While the illustrative embodiment has been shown and described in relation to a battery pack used with a paging receiver or similar portable radio equipment, it is of course applicable to any other electronic parts usable with electronic equipment.

Figure 7:
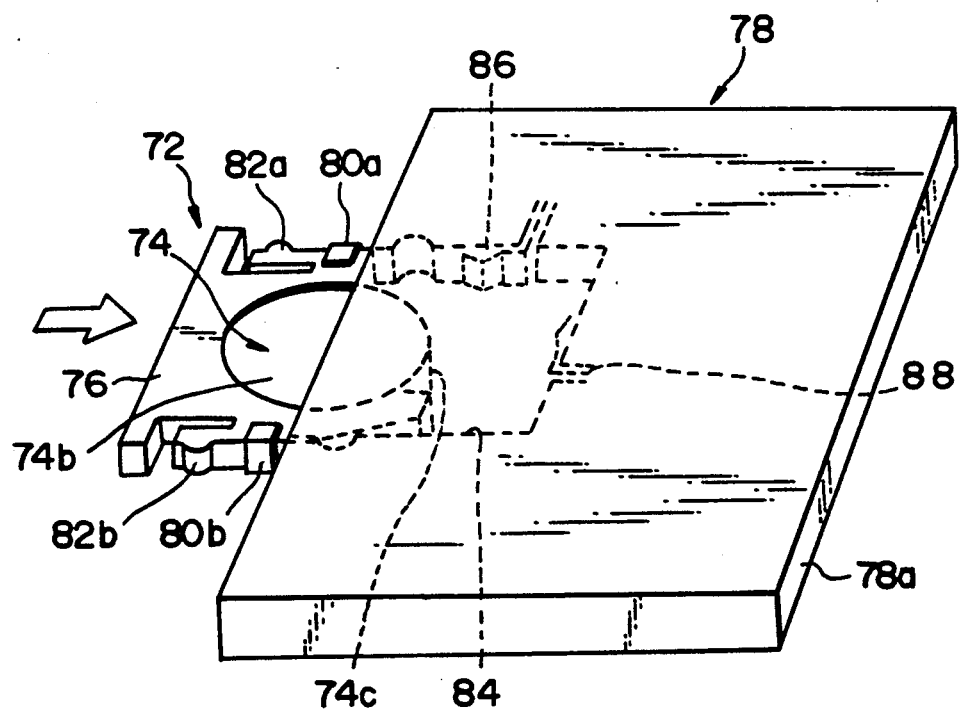
FIG. 7 is a perspective view of a battery pack and a charging unit which are representative of an alternative embodiment of the present invention.
Figure 8:
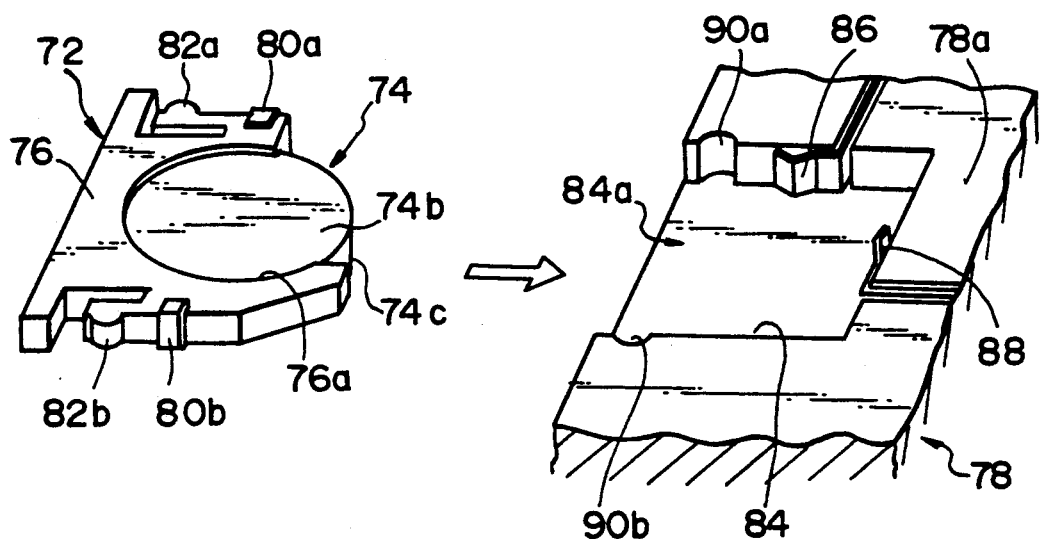
FIG. 8 is an enlarged fragmentary perspective view of the charging unit shown in FIG. 7.
Figure 9:
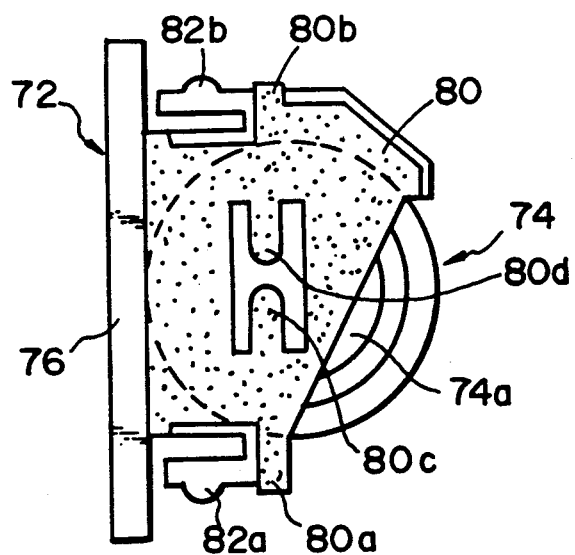
FIG. 9 is a bottom view of the battery pack shown in FIGS. 7 and 8.

Referring to FIGS. 7 to 9, an alternative embodiment of the present invention will be described. This embodiment is practicable with a charging unit which is used to charge a rechargeable battery. To charge a rechargeable battery, it is necessary to mount the battery in a correct position on a charging unit so that the positive and negative electrodes of the former may be correctly connected to the positive and negative terminals of the latter. It has been customary to remove such a battery from a battery holder of a battery pack and then set it on a charging unit every time it needs recharging, as stated earlier. The alternative embodiment allows a battery pack carrying a battery therewith to be mounted on a charging unit while insuring correct connection of the opposite electrodes of the battery to the opposite terminals of the charging unit.

In FIGS. 7 to 9, there are shown a battery pack 72 having a battery holder 76, a rechargeable battery 74 held by the battery holder 76, and a charging unit 78 for charging the battery 74 held by the battery holder 76. The battery holder 76 is implemented as a single molding of resin or similar insulative material, while the battery 74 is a button type battery. Specifically, the metallic sheath of the battery 74 is configured such that one 74a. FIG. 9, of opposite circular major surfaces serves as one electrode such as a positive electrode, while the other circular major surface 74b and the circumstantial surface 74c contiguous with the surface 74b serve as the other electrode such as a negative electrode. As shown in FIGS. 8 and 9, the circumferential surface 74c is partly exposed to the outside at the leading end of the battery holder 76 with respect to the intended direction of insertion into the charging unit 78. The battery holder 76 has a generally semicircular recess 76a. FIG. 8. The battery 74 is retained in the recess 76c with its circumferential surface 74c engaging with the wall of the recess 76c. As shown in FIG. 9 a conductive plate 80 is provided on the bottom of the battery holder 76 and extends over a major portion of the recess 76a. The conductive plate 80 has a pair of outwardly extending tongues 80a and 80b at opposite sides thereof. The tongues 80a and 80b are bent and crimped to affix the conductive plate 80 to the opposite sides of the battery holder 76. These tongues 80a and 80b not only serve to affix the conductive plate 80 to the battery holder 76 but also play the role of contacts. Further, the conductive plate 80 is partly removed to form a pair of tongues 80a and 80d which extend toward each other, as illustrated. The tongues 80c and 80d are held in contact with the surface 74a, or positive electrode, of the battery 74, thereby electrically connecting the conductive plate 80 to the battery 74. Resilient lugs 82a and 82b extend out from opposite sides of the battery holder 76.

The charging unit 78 has a casing 78 which is provided with a rectangular bore 84 for receiving the battery pack 72. The bore 84 serves as a battery chamber 84. A connecting terminal 86 is implemented by a resilient conductive piece and fitted on one of opposite side walls of the battery chamber 84. The connecting terminal 86 is connected to one pole of a charging circuit, not shown. Likewise, a connecting terminal 88 in the form of a resilient conductive piece is fitted on the innermost wall of the battery chamber 84 and connected to the other pole of the charging circuit. Recesses 90a and 90b are formed in opposite side walls of the battery chamber 84 adjacent to the open end 84a of the latter. The lugs 82a and 82b of the battery holder 76 mate with the individual recesses 90a and 90b when the battery pack 72 is inserted in the battery chamber 84.

The charging unit 78 recharges the battery 74 which is held by the battery holder 76 of the battery pack 72, as follows. First, the battery pack 72 is removed from radio equipment, not shown, such as the battery pack containing portion 54 of the radio equipment shown in FIG. 4. Then, the battery pack 72 is inserted in the battery chamber 84 of the charging unit 78 until its lugs 82a and 82b mate with the recesses 90a and 90b of the charging unit 78. In this condition, the entire battery pack 72 is retained in the battery chamber 84. The connecting terminal 86 contacts on of the contacts 80a and 80b (contact 80a in the condition shown in FIG. 8) and is electrically connected to one major surface or positive electrode 74a of the battery 74 via the conductive plate 80. The connecting terminal 88 directly contacts the circumferential surface or negative electrode 74c of the battery 74. Hence, the battery pack 72 can be mounted on the charging unit 78 while holding the battery 74 in the battery holder 76. In such a condition, a charging current may be fed from the charging circuit to the opposite electrodes of the battery 74 via the terminals 86 and 88, contact 80a, and circumferential surface 74c the battery 74.

Assume that the battery pack 72 is inserted in the battery chamber 84 upside down, i.e., in a position opposite to the position shown in FIG. 8. Then, the connecting terminal 86 contacts the other contact 80b. Nevertheless, the terminal 86 is electrically connected to the major surface or positive electrode 74a of the battery via the conductive plate 80, while the connecting terminal 88 is brought into direct contact with the circumferential surface or negative electrode 74c of the battery 74. This also successful in setting up electrical connection of the battery 74 to the charging unit 78 and, therefore, in recharging the battery 74.

The embodiment described above with reference to FIGS. 7 to 9 causes a pair of connecting terminals connected to opposite poles of a charging circuit to be automatically and correctly connected to opposite electrodes of a battery when a battery pack is loaded in a battery chamber of a charging unit. Hence, the battery can be recharged without being removed from a battery holder included in the battery pack. This promotes easy handling of the battery and easy charging operations. Further, even when the battery pack is placed in the battery chamber upside down, the opposite electrodes of the battery are connected correctly to the connecting terminals of the charging unit. This eliminates damage to the battery ascribable to the misplacement of the battery pack.

Various modifications will become possible for those skilled in the art after receiving the teachings of the present disclosure without departing from the scope thereof.

What is claimed is:
1. A radio device, comprising:
   (a) electronic circuitry and an antenna, said antenna having antenna related parameters associated therewith;
   (b) a battery compartment;
   (c) a removable battery pack including a battery, said battery pack being mountable in said battery compartment in first and second positions;
   (d) detecting means for detecting the position of said battery pack in said battery compartment and for providing a detecting signal indicative of said position; and
   (e) means coupled to said detecting signal and effective for control said antenna related parameters responsive to said detecting signal.

2. A device as claimed in claim 1, comprising a casing in which said battery compartment is located said battery pack including a positive and a negative terminal respectively electrically connectable to a positive electrode and a negative electrode the battery.

3. A device as claimed in claim 2, wherein said battery pack comprises a battery holder for holding the battery, and a control member located at a predetermined position of said battery holder.

4. A device as claimed in claim 3, wherein said battery compartment further comprises a control terminal electrically connectable to said control member of said battery pack.

5. A device as claimed in claim 4, wherein said detecting means is effective for determining the position of said battery pack on the basis of whether or not said control terminal and said control member are connected to each other when said battery pack is accommodated in said battery compartment.

6. An electrical device, comprising:
   (a) a charging unit and electronic circuitry associated therewith;
   (b) a battery compartment;
   (c) a removable battery pack including a battery, said battery pack being mountable in said battery compartment in first and second positions;
   (d) detecting means for detecting the position of said battery pack in said battery compartment and for producing a detecting signal representative of said position;
   (e) means for supplying current to electrical electrodes of said battery from said charging unit; and
   (f) means coupled to said detecting signal and effective for controlling the polarity of current supplied from said charging unit on the basis of said detecting signal.

7. A device as claimed in claim 6, wherein said charging unit comprises a casing, said battery compartment being provided in said casing for accommodating said battery pack, said battery compartment comprising a positive and a negative terminal connected to said electronic circuitry.

8. A device as claimed in claim 7, wherein said battery pack comprises a battery holder for holding the battery, and a connecting member provided on said battery holder for contacting either one of said positive and negative terminals of said battery compartment.

9. A device as claimed in claim 8, wherein the battery comprises a button type battery having a metallic sheath which is provided with opposite flat circular major surfaces and a circumferential surface contiguous with one of said major surfaces, said one major surface and said circumferential surface constituting one electrode of said battery and the other major surface constituting the other electrode, the other terminal of said battery pack contacting and being electrically connected to said circumferential surface of battery.

10. A device as claimed in claim 9, wherein said charging unit further comprises locking means for locking said battery pack when said battery pack is accommodated in said battery compartment.

11. A device as claimed in claim 10, wherein said locking means comprises a pair of recesses provided in said battery compartment, and a pair of lugs provided on said battery holder of said battery pack for mating with said pair of recesses.

12. A device comprising:
   (a) battery pack means for holding a battery, said battery pack means having a first output terminal electrically connected to a first battery output terminal of said battery, and second and third output terminals electrically connected to a second battery output terminal of said battery; and
   (b) battery compartment means for accommodating said battery pack means therein, said battery compartment means having first and second input terminals to which electrical power is applied from said battery;
   (c) said battery pack means being mountable in said battery compartment means in first and second predetermined mounting positions, said second input terminal of said compartment means being electrically connected to said first output terminal of said battery pack means, and including means for electrically connecting said first input terminal of said battery compartment means to one of said second and third output terminals of said battery pack means.

* * * * *